United States Patent
Kurata et al.

(10) Patent No.: US 9,059,238 B2
(45) Date of Patent: Jun. 16, 2015

(54) SEMICONDUCTOR DEVICE

(71) Applicant: FUJI ELECTRIC CO., LTD., Kawasaki-shi (JP)

(72) Inventors: Naoko Kurata, Kawasaki (JP); Seiji Momota, Matsumoto (JP); Hitoshi Abe, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/176,610

(22) Filed: Feb. 10, 2014

(65) Prior Publication Data

US 2014/0159107 A1 Jun. 12, 2014

Related U.S. Application Data

(63) Continuation of application No. PCT/JP2012/072823, filed on Sep. 6, 2012.

(30) Foreign Application Priority Data

Sep. 8, 2011 (JP) ................... 2011-195970

(51) Int. Cl.
*H01L 29/66* (2006.01)
*H01L 29/739* (2006.01)
(Continued)

(52) U.S. Cl.
CPC ........... *H01L 29/7397* (2013.01); *H01L 29/404* (2013.01); *H01L 29/0619* (2013.01);
(Continued)

(58) Field of Classification Search
CPC ..................... H01L 29/66074; H01L 29/0696; H01L 29/4236

USPC .................................. 257/330, 510, 520, 586
See application file for complete search history.

(56) References Cited

U.S. PATENT DOCUMENTS 6,462,376 B1 10/2002 Wahl et al.
2004/0238884 A1 12/2004 Tanaka et al.
(Continued)

FOREIGN PATENT DOCUMENTS

JP 10-070271 A 3/1998
JP 2005-019734 A 1/2005
(Continued)

OTHER PUBLICATIONS

European Search Report issued in European counterpart application No. EP12829990.6, dated Jan. 9, 2015.
(Continued)

*Primary Examiner* — Jarret Stark
*Assistant Examiner* — Shahed Ahmed
(74) *Attorney, Agent, or Firm* — Rossi, Kimms & McDowell LLP

(57) ABSTRACT

Some aspects of the invention include a trench gate structure including a p base layer, an $n^+$ emitter region, a trench, a gate oxide film, and a doped polysilicon gate electrode is provided in an active region. A p-type extension region formed by extending the p base layer to an edge termination structure region can be provided in the circumference of a plurality of trenches. One or more annular outer trenches which are formed at the same time as the plurality of trenches are provided in the p-type extension region. The annular outer trenches can surround all of the trenches. A second gap between the annular outer trench and the outermost trench or between adjacent annular outer trenches is less than a first gap between adjacent trenches.

9 Claims, 6 Drawing Sheets

(51) Int. Cl.
 *H01L 29/40* (2006.01)
 *H01L 29/06* (2006.01)
 *H01L 29/423* (2006.01)

(52) U.S. Cl.
 CPC .......... *H01L29/0615* (2013.01); *H01L 29/407* (2013.01); *H01L 29/42368* (2013.01); *H01L 29/0696* (2013.01)

(56) References Cited

U.S. PATENT DOCUMENTS

| 2004/0262678 A1 | 12/2004 | Nakazawa et al. | |
|---|---|---|---|
| 2005/0145936 A1* | 7/2005 | Polzl et al. | 257/341 |
| 2005/0199952 A1* | 9/2005 | Hsieh et al. | 257/339 |
| 2005/0280078 A1 | 12/2005 | Teramae et al. | |
| 2008/0042172 A1 | 2/2008 | Hirler et al. | |
| 2008/0087951 A1 | 4/2008 | Takaya et al. | |
| 2008/0087952 A1 | 4/2008 | Pfirsch | |
| 2008/0251810 A1 | 10/2008 | Torii | |
| 2010/0078774 A1 | 4/2010 | Hirler | |
| 2010/0140697 A1* | 6/2010 | Yedinak et al. | 257/334 |
| 2012/0193748 A1* | 8/2012 | Yedinak et al. | 257/488 |
| 2013/0020635 A1* | 1/2013 | Yilmaz et al. | 257/334 |
| 2014/0048869 A1* | 2/2014 | Yedinak et al. | 257/330 |

FOREIGN PATENT DOCUMENTS

| JP | 2006-005248 A | 1/2006 |
|---|---|---|
| JP | 2006-128507 A | 5/2006 |
| JP | 2007-165635 A | 6/2007 |
| JP | 2008-103683 A | 5/2008 |

OTHER PUBLICATIONS

International Search Report issued in PCT/JP2012/072823, dated Oct. 9, 2012. English translation provided.

* cited by examiner

SEMICONDUCTOR DEVICE

CROSS-REFERENCE TO RELATED APPLICATION

This application is a continuation of International Application No. PCT/JP2012/72823, filed on Sep. 6, 2012, which is based on and claims priority to Japanese Patent Application No. JP 2011-195970, filed on Sep. 8, 2011. The disclosure of the Japanese priority application and the PCT application in their entirety, including the drawings, claims, and the specification thereof, are incorporated herein by reference.

BACKGROUND

1. Field of the Invention

Embodiments of the invention relate to power semiconductor devices that include a trench gates.

2. Related Art

With a reduction in the power consumption of a power conversion device, it is expected that the power consumption of a power semiconductor device (switching device) which plays a central role in the power conversion device will be reduced. In recent years, a power insulated gate (MOS) semiconductor device with a trench gate structure capable of considerably increasing channel density has been put to practical use as a semiconductor device capable of contributing to reducing the power consumption. An example of the power MOS semiconductor device with the trench gate structure is an IGBT (insulated gate bipolar transistor) which is typified by a power MOSFET (insulated gate field effect transistor).

The bipolar semiconductor device, such as an IGBT, has a structure for preventing the holes injected from a collector from moving to an emitter electrode, that is, a structure for reducing the area ratio of an emitter region which is electrically connected to the emitter electrode, in addition to the trench gate structure for improving channel density. In other words, the bipolar semiconductor device has a structure for relatively increasing the area of a floating region which is formed in the same plane as the emitter region and is disposed at a different position from the emitter electrode so as to be insulated from the emitter electrode. This structure makes it possible to obtain the effect of storing carriers to the emitter of a drift layer. Therefore, it is possible to reduce an on voltage and steady loss even in the layer structure of a general high breakdown voltage semiconductor device in which the on voltage is likely to increase due to a thick drift layer.

The structure of the trench gate IGBT will be described with reference to FIGS. 3 and 4. FIG. 3 is a cross-sectional view illustrating the structure of a main portion of the trench gate IGBT according to the related art. FIG. 4 is a plan view illustrating the structure of the main portion of the trench gate IGBT according to the related art. FIG. 4 is a plan view illustrating a main portion of a region including (a portion of) an active region 30 and (a portion of) an edge termination structure region 40 which is provided in the periphery of the active region 30. FIG. 3 is a cross-sectional view taken along the line B-B' of FIG. 4. In the main portion plan view illustrated in FIG. 4, for ease of understanding of a surface structure pattern, an aluminum electrode on the outermost surface and a silicon oxide film below the aluminum electrode are not illustrated.

As illustrated in FIGS. 3 and 4, particularly in a region which serves as a main current path in the active region 30, a p base layer 2 (p channel layer) and an $n^+$ emitter region 8 are provided in the front surface of a semiconductor substrate which will be an $n^-$ drift layer 1 ($n^-$ base layer). In addition, trenches 3 are formed at a depth more than that of the p base layer 2 from the surfaces of the p base layer 2 and the $n^+$ emitter region 8. A plurality of trenches 3 are formed along the surface of the $n^-$ drift layer 1 (the surface close to the front surface of the semiconductor substrate), with a predetermined gap a therebetween. A doped polysilicon gate electrode 11 is provided in the trench 3, with a gate oxide film 10 interposed therebetween, to form a trench gate.

An interlayer insulating film 4 is formed on the surface of the $n^-$ drift layer 1 so as to cover an upper portion (exposed portion) of the doped polysilicon gate electrode 11 in the trench 3. In addition, a metal film which will be an emitter electrode 5 is formed on the surface of the $n^-$ drift layer 1 with the interlayer insulating film 4 interposed therebetween. The metal film which will be the emitter electrode 5 is also formed on the surfaces of the $n^+$ emitter region 8 and the p base layer 2 so as to commonly contact the surfaces. A $p^+$ collector layer 13 is formed on a surface layer of the rear surface of the semiconductor substrate which will be the $n^-$ drift layer 1 ($n^-$ base layer). A collector electrode 6 comes into ohmic contact with the surface of the $p^+$ collector layer 13.

In many cases, in the trench gate IGBT, a $p^+$ contact layer 9 is provided in the p base layer 2 in order to increase latch-up resistance. It is preferable that an $n^+$ buffer layer 14 be provided between the $n^-$ drift layer 1 and the $p^+$ collector layer 13, in order to reduce the thickness of the high-resistance $n^-$ drift layer 1. A p-type extension region C which extends from the p base layer 2 to the edge termination structure region 40 is provided in the outer circumference of the active region 30. The trench 3 is not provided in the p-type extension region C.

A region in which a doped polysilicon gate electrode 11 for a gate runner is formed on the surface of the p-type extension region C with the gate oxide film 10 interposed therebetween and an emitter electrode contact hole 21, which is an opening of an oxide film for bringing the emitter electrode 5 into direct contact with a silicon surface, are provided in the surface (the surface close to the front surface of the semiconductor substrate) of the p-type extension region C. The doped polysilicon gate electrode 11 for a gate runner and the doped polysilicon gate electrode 11 for the trench gate structure described above are formed at the same time.

The doped polysilicon gate electrode 11 for a gate runner and the doped polysilicon gate electrode 11 for a trench gate are electrically connected to each other in a portion (not illustrated). An aluminum gate electrode line 12 which will be a gate runner contacts the surface of the doped polysilicon gate electrode 11 for a gate runner through the opening provided in the oxide film. The doped polysilicon gate electrode 11 for a trench gate structure is drawn to the surface of the chip by the aluminum gate electrode line 12.

The edge termination structure region 40 is provided outside the p-type extension region C which is disposed in the outer circumferential edge of the p base layer 2. In the edge termination structure region 40, annular $p^+$ guard rings 15 and 16 are provided at a depth equal to or more than the depth of the p base layer 2, with a predetermined gap from the p-type extension region C. The $p^+$ guard rings 15 and 16 which are a portion of the edge termination structure region 40 surround the active region 30.

Doped polysilicon field plates 18 and 19 are respectively provided on the surfaces of the $p^+$ guard rings 15 and 16, with an insulating film 17 which is formed at the same time as the gate oxide film 10 interposed therebetween. The doped polysilicon field plates 18 and 19 are formed so as to cover the surfaces of the $p^+$ guard rings 15 and 16 and the surface of portions of the $n^-$ drift layer 1 adjacent to the $p^+$ guard rings. The $p^+$ guard rings 15 and 16 and the doped polysilicon field plates 18 and 19 are electrically connected to each other in a portion (not illustrated) by an aluminum field plate 20.

For the trench gate IGBT, a structure has been proposed in which an additional trench for reducing the electric field when a depletion layer is spread from the pn junction between the p base layer and the n⁻ drift layer in an off state is provided in a p base layer (corresponding to the p-type extension region C in FIG. 3) which is arranged outside the trench at the outermost (hereinafter, referred to as an outermost trench) in the active region. See, for example, Japanese Patent Application Publication No. JP 10-70271 A (also referred to herein as "Patent Document 1") and Japanese Patent Application Publication No. JP 2008-103683 A (also referred to herein as "Patent Document 2").

In addition, as another trench gate IGBT, a structure has been proposed in which an isolation trench is formed outside a termination trench among trench gates in an active region, a p base layer of the active region extends to the isolation trench, and an emitter electrode which is connected to the surface of the active region is also connected to the surface of the end of the extended p base layer. See, for example, Japanese Patent Application Publication No. JP 2006-5248 A (also referred to herein as "Patent Document 3").

However, in the trench gate IGBT according to the related art disclosed in Patent Document 3, when the depletion layer is spread from the pn junction between the p base layer and the n⁻ drift layer in the off state, the curvature radius of the depletion layer is likely to be reduce at the bottom of the trench in the active region. This phenomenon is noticeable particularly at the bottom of the outermost trench (termination trench) in the active region. Therefore, the electric field at the bottom of the termination trench is likely to be higher than that at the bottom of the trench other than the trench at the termination of the active region. As a result, the electric field is likely to concentrate on the bottom of the termination trench and avalanche breakdown occurs at a low voltage, which results in a reduction in the breakdown voltage. In the actual design of an element structure, a high-resistivity semiconductor substrate is used to increase the thickness of the n⁻ drift layer, considering a reduction in the breakdown voltage due to the concentration of the electric field on the bottom of the termination trench. As a result, for example, the on voltage and turn-off loss increase.

As disclosed in Patent Document 1 and Patent Document 2, in the structure in which only the gap between the additional trenches provided outside the termination trenches is reduced in order to reduce the electric field formed at the bottom of the additional trench, the necessary electric field reduction effect is not obtained. In addition, as disclosed in Patent Document 3, in the structure in which the p base layer and the emitter electrode are connected to each other on the surface of the chip-outer-circumferential-side end of the p base layer which extends from the active region to the outside of the termination trench, holes are likely to be emitted from a connection portion of the p base layer with the emitter electrode when the device is turned off. Therefore, there is a concern that the electric field will concentrate on the connection portion and breakdown will occur due to current concentration.

Thus, as described above, there exists certain problems in the related art

SUMMARY OF THE INVENTION

Embodiments of the invention address these and other problems in the related art. To address the above-mentioned problems, a semiconductor device according to embodiments of the invention has the following characteristics. A first-conduction-type drift layer that is a first-conduction-type semiconductor substrate is provided. In an active region, a second-conduction-type base layer is provided in one main surface of the first-conduction-type semiconductor substrate. A first-conduction-type semiconductor region is selectively provided in the second-conduction-type base layer. A plurality of trenches extend from the one main surface of the first-conduction-type semiconductor substrate to the first-conduction-type drift layer through the first-conduction-type semiconductor region and the second-conduction-type base layer and are arranged with a predetermined first gap therebetween. A trench gate structure including a gate insulating film that is provided in the trench along an inner wall of the trench and a gate electrode that is provided in the trench with the gate insulating film interposed therebetween is provided. A metal electrode that contacts the second-conduction-type base layer and the first-conduction-type semiconductor region is provided. A second-conduction-type extension region that is a portion of the second-conduction-type base layer extending outward from the outermost trench among the plurality of trenches is provided. One or more annular outer trenches that extend from the one main surface of the first-conduction-type semiconductor substrate to the first-conduction-type drift layer through the second-conduction-type extension region and surround all of the trenches are provided. An edge termination structure region that surrounds the active region is provided. A second gap between the annular outer trench and the outermost trench or between the adjacent annular outer trenches when the plurality of annular outer trenches are provided is less than the first gap.

In the semiconductor device according to some embodiments, the plurality of trenches may be arranged in the one main surface of the first-conduction-type semiconductor substrate in a stripe shape which extends in a direction perpendicular to a direction in which the trenches are arranged. In the semiconductor device according the invention, when the second gap is b and the first gap is a, it is preferable that b/a<0.8 be satisfied, and it is more preferable that b/a<0.6 be satisfied.

In the semiconductor device according to some embodiments, a surface of a portion of the second-conduction-type extension region which is interposed between the annular outer trench and the outermost trench or between the adjacent annular outer trenches when the plurality of annular outer trenches are provided may be electrically connected to the metal electrode. In the semiconductor device according to the invention, two or more annular outer trenches may be provided.

The semiconductor device according to some embodiments may further include an insulating film that covers the second-conduction-type extension region. The insulating film may include an opening through which a portion of the second-conduction-type extension region which is arranged outside the outermost annular outer trench is exposed. The second-conduction-type extension region may be electrically connected to the metal electrode through the opening.

The semiconductor device according some embodiments may further include an insulating film that is provided on the one main surface of the first-conduction-type semiconductor substrate and insulates the metal electrode from the gate electrode. A portion which directly contacts the metal electrode and a portion which contacts the metal electrode with the insulating film interposed therebetween may be alternately arranged on the one main surface of the first-conduction-type semiconductor substrate in the active region. In the semiconductor device according to the invention, the ends of two adjacent trenches may be connected to each other.

According to some embodiments described above, since the second gap is less than the first gap, it is possible to prevent the concentration of the electric field in the vicinity of the bottom of the trench gate. In addition, since the P-type extension region and the emitter electrode are electrically connected to each other on the surface of the end of the p-type extension region close to the annular outer trench, it is possible to prevent the concentration of the electric field on the p-type extension region when the device is turned off.

According to some embodiments, it is possible to provide a semiconductor device capable of preventing a reduction in breakdown voltage and improving a turn-off breakdown voltage.

DETAILED DESCRIPTION

Figure 1:
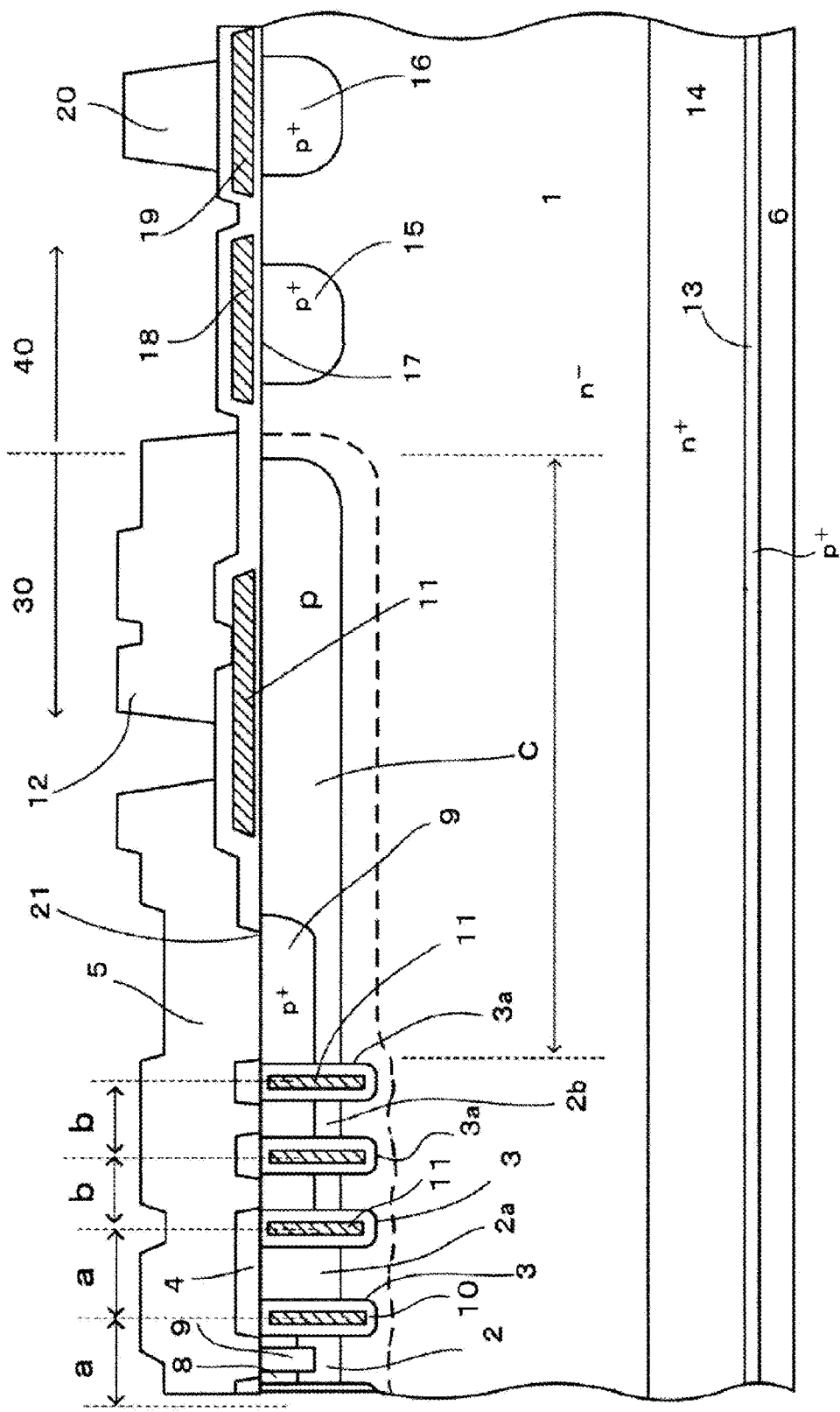
FIG. 1 is a cross-sectional view illustrating the structure of a main portion of a trench gate IGBT according to an embodiment of the invention.

Hereinafter, a semiconductor device according to an exemplary embodiment of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher and lower than that of the layer or the region without the symbols. In the description of the following embodiment and the accompanying drawings, the same components are denoted by the same reference numerals, and the description thereof will not be repeated. In addition, various modifications and changes of the invention can be made without departing from the scope of the invention. The invention is not limited to the following embodiment.

Non-Limiting Exemplary Embodiment

Figure 2:
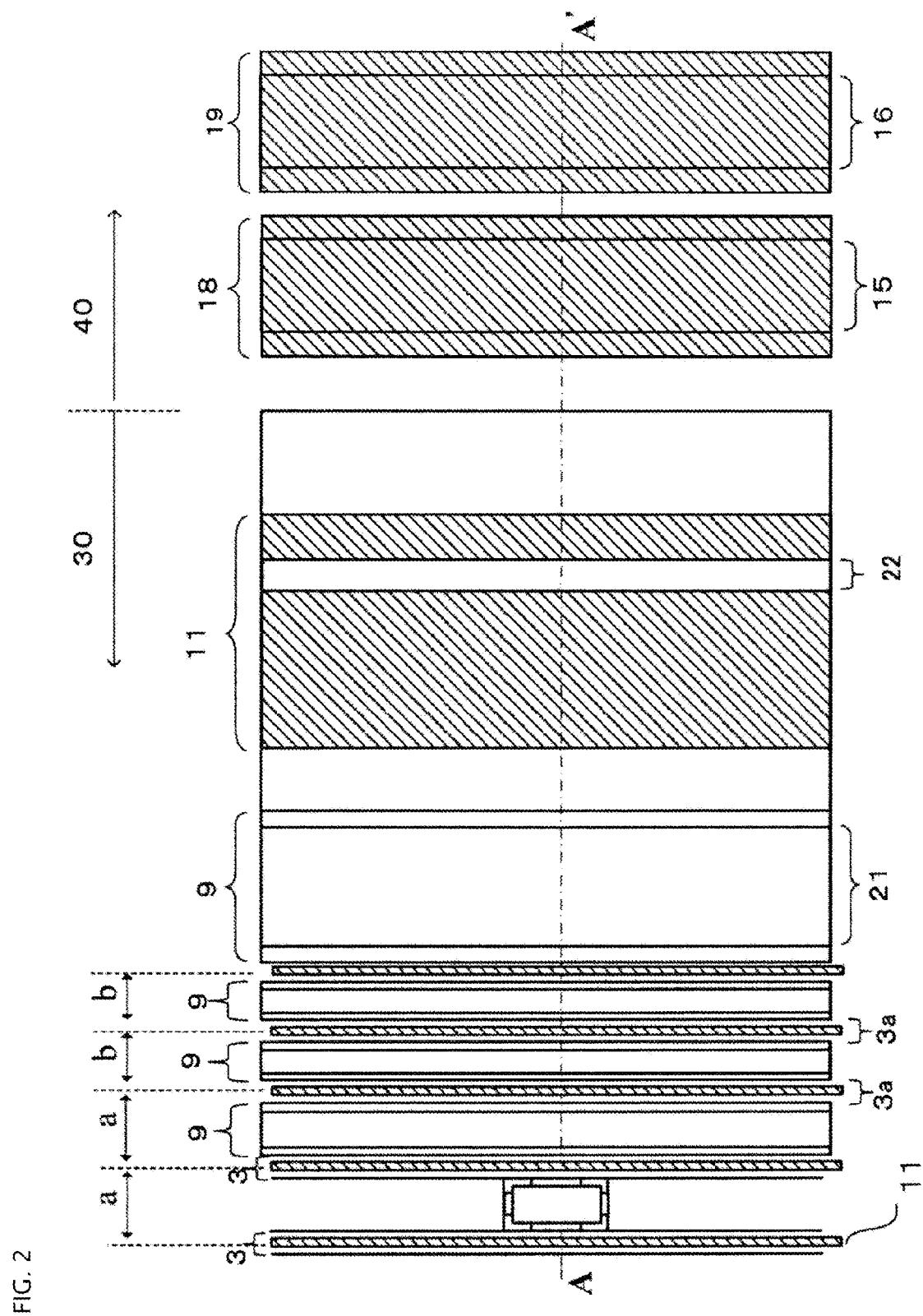
FIG. 2 is a plan view illustrating the structure of the main portion of the trench gate IGBT according to the embodiment of the invention.
Figure 3:
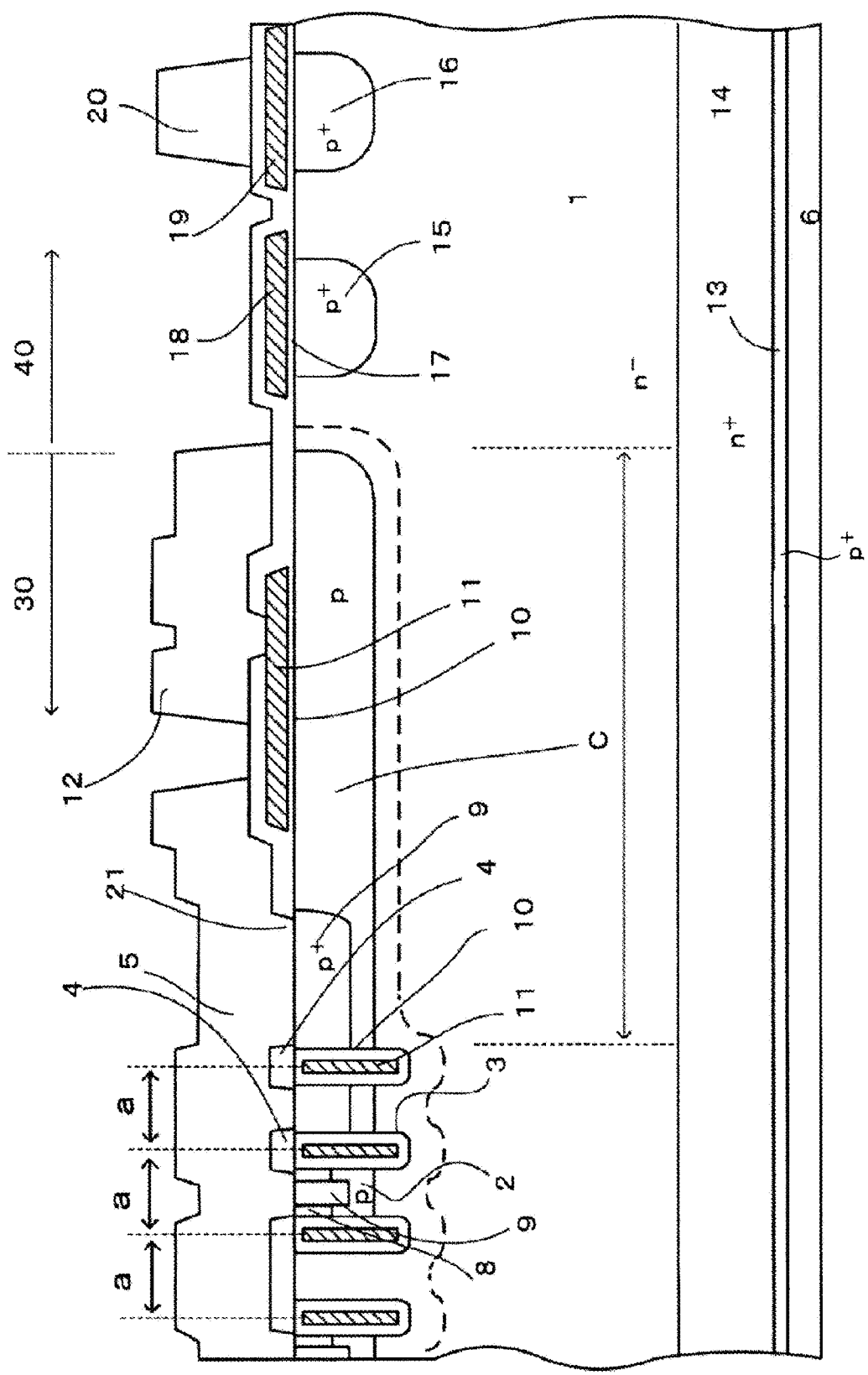
FIG. 3 is a cross-sectional view illustrating the structure of a main portion of a trench gate IGBT according to the related art.
Figure 4:
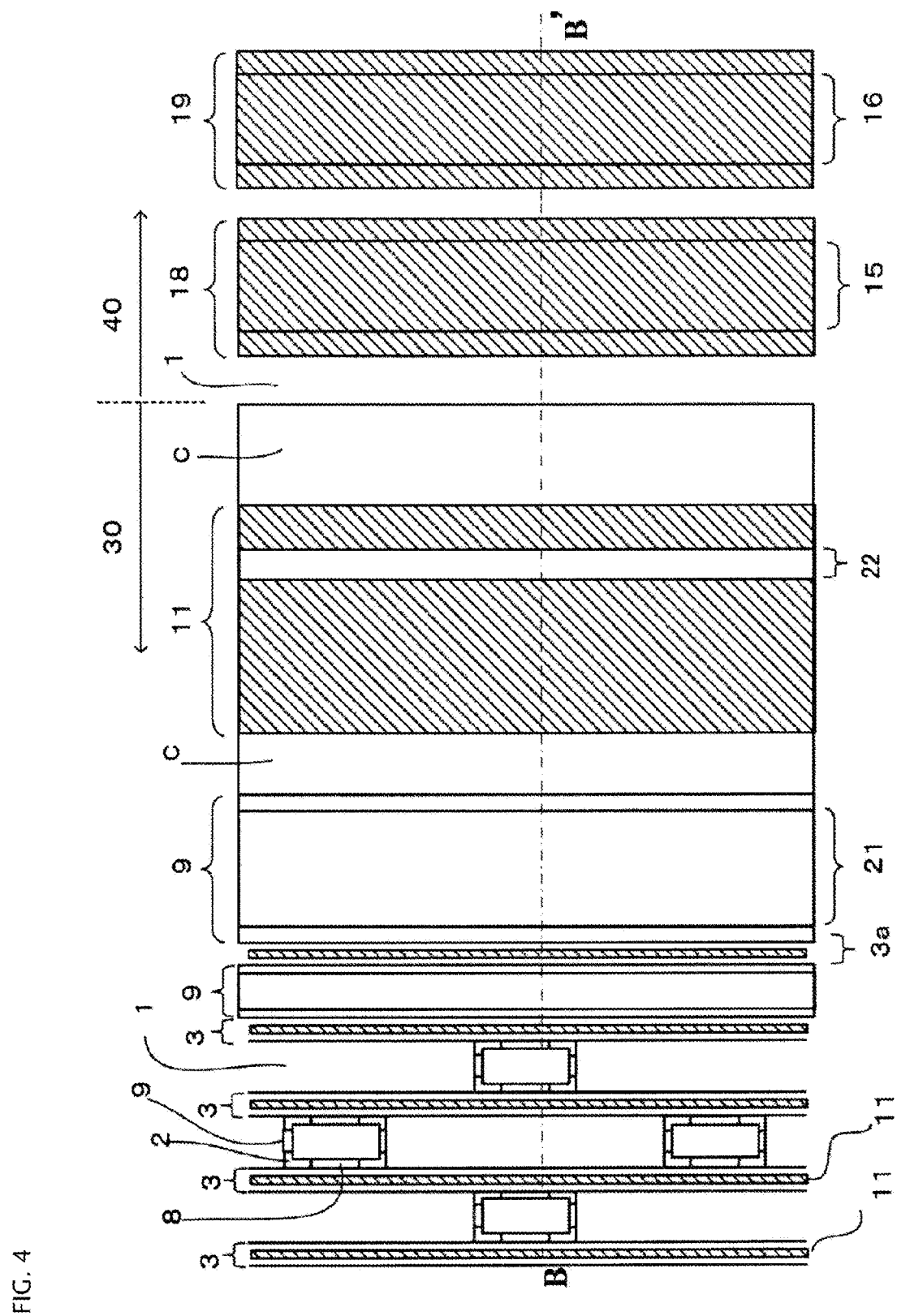
FIG. 4 is a plan view illustrating the structure of the main portion of the trench gate IGBT according to the related art.
Figure 5:
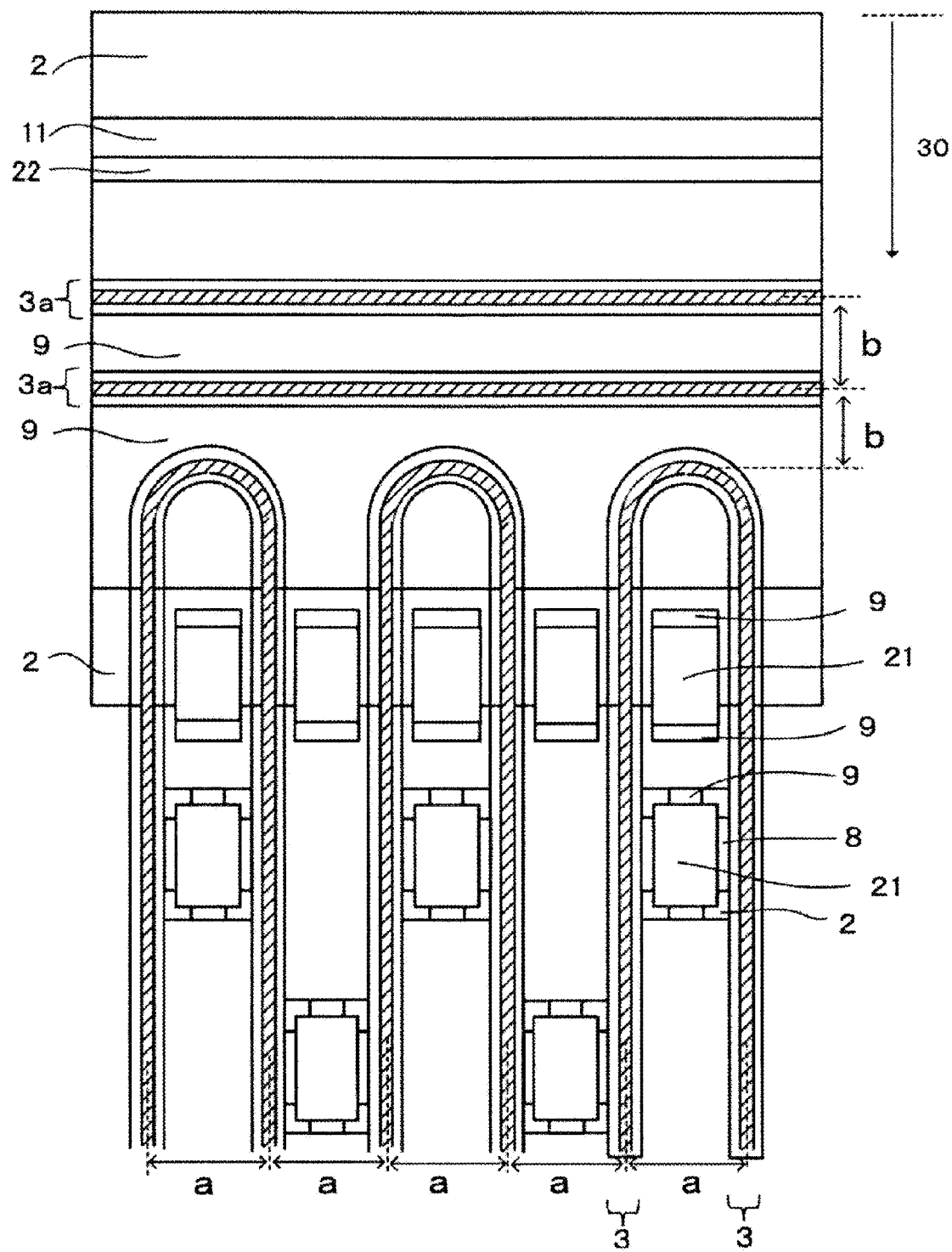
FIG. 5 is a plan view illustrating the structure of the main portion of the trench gate IGBT according to the embodiment of the invention.

The structure of a semiconductor device according to an embodiment will be described with reference to FIGS. 1, 2, and 5. FIG. 1 is a cross-sectional view illustrating the structure of a main portion of a trench gate IGBT according to the embodiment of the invention. FIGS. 2 and 5 are plan views illustrating the structure of the main portion of the trench gate IGBT according to the embodiment of the invention. FIG. 2 is a plan view illustrating a main portion of a region including (a portion of) an active region 30 and (a portion of) an edge termination structure region 40 around the active region 30. FIG. 5 is a plan view illustrating a main portion of (a portion of) the active region 30 different from the portion illustrated in FIG. 2. A hatched portion indicates a portion in which a doped polysilicon film is formed (which holds for other diagrams). FIG. 1 is a cross-sectional view taken along the line A-A' of FIG. 2.

First, the trench gate structure of the trench gate IGBT according to the embodiment will be described. As illustrated in FIGS. 2 and 5, in the active region 30, a plurality of trenches 3 are provided in the front surface of a semiconductor substrate which will be an n⁻ drift layer 1 (n⁻ base layer) with a predetermined gap (hereinafter, referred to as a first gap) a therebetween. The plurality of trenches 3 are arranged in a stripe shape which extends in a direction (a vertical direction in FIG. 2, which is referred to as a longitudinal direction) intersecting the direction in which the trenches 3 are arranged (a horizontal direction in FIG. 2, which is referred to as a lateral direction). In addition, an annular outer trench 3a which surrounds all of the plurality of trenches 3 is provided.

Two or more annular outer trenches 3a may be provided. A portion of the annular outer trench 3a which is adjacent to the trench 3 in the lateral direction of the trench 3 is parallel to the longitudinal direction of the trench 3 (FIG. 2). A portion of the annular outer trench 3a which is adjacent to the longitudinal end of the trench 3 in the longitudinal direction of the trench 3 is perpendicular to the trench 3 (FIG. 5). That is, FIG. 5 illustrates the planar pattern of the trench in the vicinity of the end of the trench 3 in the longitudinal direction. In addition, FIG. 5 illustrates an example of the pattern in which the ends of two adjacent trenches 3 in the longitudinal direction are connected in a curved shape.

A gate oxide film 10 is provided in the trench 3 along the inner wall of the trench 3. In addition, a doped polysilicon gate electrode 11 is provided inside the gate oxide film 10 in the trench 3. In this way, a trench gate structure is formed. A cylindrical trench gate may be provided in which the doped polysilicon gate electrode 11 is provided in the cylindrical trench 3 with the gate oxide film 10 interposed therebetween. In this case, the arrangement pattern of the trenches 3 may be a dot pattern in which the trenches 3 are regularly arranged at the vertexes of a triangle lattice.

In addition, a doughnut-shaped trench gate may be provided in which the cylindrical n⁻ drift layer 1 is provided in the doped polysilicon gate electrode 11 of the cylindrical trench gate with the gate oxide film 10 interposed therebetween. When the doughnut-shaped trench gate is provided, the arrangement pattern of the trenches 3 may be a ring dot pattern in which the trenches are regularly arranged at the vertexes of the triangle lattice, similarly to when the cylindrical trench gate is provided.

Among the arrangement patterns of the trenches 3, an arrangement pattern (stripe-shaped pattern) in which a plurality of adjacent trenches 3 which linearly extend in the longitudinal direction are regularly arranged in parallel to each other is preferable since equipotential lines are likely to be planar. In the plan views of FIGS. 2 and 5 which illustrate the main portion of the trench gate IGBT according to the embodiment, for ease of understanding of each surface structure pattern, the outermost aluminum electrode and a silicon oxide film below the outermost aluminum electrode are not represented.

Next, structures other than the trench 3 and the annular outer trench 3a of the trench gate IGBT according to the embodiment will be described. As illustrated in FIGS. 1, 2, and 5, a p base layer 2 (p channel layer) and an n⁺ emitter region 8 are provided in a region which is interposed between the trenches 3 and serves as a current path in, particularly, an on state in the active region 30. The n⁺ emitter region 8 is selectively provided in the p base layer 2. The trench 3 described above passes through the p base layer 2 and the n⁺ emitter region 8 from (surfaces close to the front surface of the semiconductor substrate) the surfaces of the p base layer 2 and the n⁺ emitter region 8 and is provided with a depth more than that of the p base layer 2.

A high positive voltage which is equal to or more than a threshold voltage with respect to an emitter electrode 5 is applied to the doped polysilicon gate electrode 11 forming the trench gate structure to form an n channel (not illustrated) in a portion of the p base layer 2 which faces the gate oxide film 10 on the side wall of the trench 3 and is interposed between the n⁻ drift layer 1 and the n⁺ emitter region 8. Electrons which are injected from the emitter electrode 5 to the n⁺ emitter region 8 pass through the n channel and are than injected into the n⁻ drift layer 1. Then, holes are injected from the collector electrode 6 to the n⁻ drift layer 1. In this way, conductivity is modulated in the n⁻ drift layer 1 and a current flows at a low on voltage.

In the trench gate IGBT according to the embodiment, in order to reduce the on voltage described above, a floating region 2a which is insulated from the emitter electrode 5 may be provided in the active region 30. The floating region 2a is insulated from the emitter electrode 5 by an interlayer insulating film 4. The n⁺ emitter region 8 is not formed in the floating region 2a. It is preferable that a region in which the n⁺ emitter region 8 is formed and a channel current flows and a region in which the floating region 2a is provided and there is no current path be alternately formed in a surface layer of the p base layer 2 between the plurality of trenches 3. In FIG. 5, reference numeral 22 indicates a gate electrode contact hole. The structure of the surface of the n⁻ drift layer 1 (the surface close to the front surface of the semiconductor substrate) and the edge termination structure region 40 will be described below.

In the trench gate IGBT according to the invention, the p base layer 2 extends from the trench 3 which is closest to the edge termination structure region 40 in the lateral direction of the trench 3 among the trenches 3 described above to the edge termination structure region 40 in the lateral direction of the trench 3. Hereinafter, a portion of the p base layer 2 which extends from the trench 3 closest to the edge termination structure region 40 in the lateral direction of the trench 3 to the edge termination structure region 40 is referred to as a p-type extension region C. The first feature of the trench gate IGBT according to the invention is that one or more annular outer trenches 3a surrounding all of the trenches 3 are provided in the p-type extension region C.

When the gap between the annular outer trench 3a and the outermost trench 3 in the lateral direction of the trench 3 and the smallest gap (hereinafter, referred to as a second gap) among the gaps between adjacent annular outer trenches 3a when a plurality of annular outer trenches 3a are provided are "b", the second gap b is less than a first gap "a" between adjacent trenches 3 (b<a). Specifically, the ratio of the second gap b to the first gap a (hereinafter, referred to as a trench gap ratio b/a) preferably satisfies b/a<0.8 and more preferably satisfies b/a<0.6, which is the second feature of the invention.

The third feature of the trench gate IGBT according to the invention is that the surface of a region 2b (hereinafter, referred to as a p base layer 2b) which is a portion of the p-type extension region C (p base layer 2) closer to the active region 30 than to the outermost annular outer trench 3a and comes into contact with the annular outer trench 3a is electrically connected to the emitter electrode 5. That is, the p base layer 2b is a region which is interposed between the annular outer trench 3a and the trench 3 and a region which is interposed between adjacent annular outer trenches 3a when a plurality of annular outer trenches 3a are provided, in the p-type extension region C. The operation and effect obtained by the feature points (first to third features) will be described in detail below.

Figure 6:
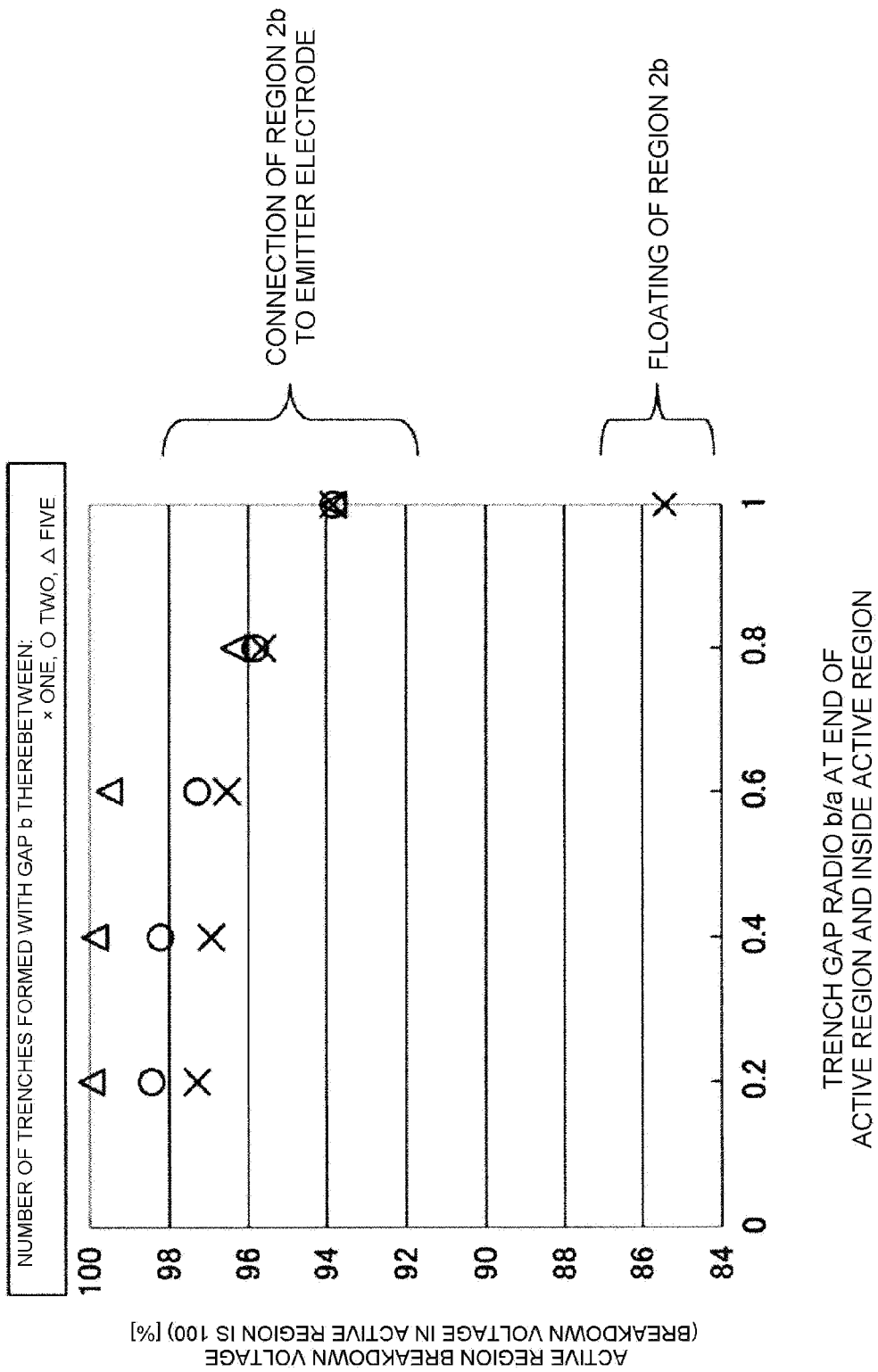
FIG. 6 is characteristic diagram illustrating the relation between a trench gap ratio and the pn junction breakdown voltage of an active region in the trench gate IGBT according to the embodiment of the invention.

FIG. 6 illustrates the simulation result for the breakdown voltage of the active region 30. FIG. 6 is a characteristic diagram illustrating the relation between the trench gap ratio b/a and the pn junction breakdown voltage of the active region 30 in the trench gate IGBT according to the embodiment of the invention. FIG. 6 illustrates the relation between the trench gap ratio b/a and the breakdown voltage simulation value of the active region 30 including the annular outer trench 3a, using the number of annular outer trenches 3a which are adjacent to each other with the second gap b therebetween as a parameter. The breakdown voltage simulation value indicates the breakdown voltage of the pn junction between the p base layer 2 and the n⁻ drift layer 1 in the active region 30 as a percentage (%) when the theoretical breakdown voltage of the pn junction is 100%.

The simulation result illustrated in FIG. 6 proved that, when the trench gap ratio b/a was less than 0.8 (b/a<0.8) and the number of annular outer trenches 3a was one to five, the breakdown voltage percentage was equal to or more than 95% and the rate of decrease in the breakdown voltage was reduced as the number of annular outer trenches 3a increased. Therefore, it was confirmed that the number of annular outer trenches 3a which were adjacent to each other with the second gap b therebetween was preferably increased such that the trench gap ratio b/a was less than 0.8 (b/a<0.8). In addition, it is more preferable that the trench gap ratio b/a be less than 0.6 (b/a<0.6). In this case, the rate of change in the breakdown voltage of the active region 30 with respect to the trench gap ratio b/a is reduced and the breakdown voltage is stabilized (the first and second features).

The result for the percentage of the breakdown voltage when the second gap b was equal to the first gap a was as follows. It was confirmed that the percentage of the breakdown voltage was about 85% in the structure in which the p base layer 2b was insulated from the emitter electrode 5 by the interlayer insulating film 4 (in FIG. 6, "floating of region 2b"). On the other hand, it was confirmed that the percentage of the breakdown voltage was equal to or more than 94%, regardless of the trench gap ratio, in the structure in which the p base layer 2b and the emitter electrode 5 were electrically connected to each other through an emitter electrode contact hole 21 selectively formed in the interlayer insulating film 4, and the rate of decrease in the breakdown voltage was too high (in FIG. 6, "connection of region 2b to emitter electrode"). Therefore, as can be seen from the result, it is preferable that the p base layer 2b which comes into contact with the annular outer trench 3a as described above be electrically connected to the emitter electrode 5 (third feature).

Next, the structure of the surface of the n⁻ drift layer 1 (the surface close to the front surface of the semiconductor substrate), the rear surface of the semiconductor substrate, and the edge termination structure region 40 in the trench gate IGBT according to the embodiment will be described. The interlayer insulating film 4 is formed so as to cover an upper portion (exposed portion) of the doped polysilicon gate electrode 11 in the trench 3. In addition, a metal film which will be the emitter electrode 5 is formed on the surface of the n⁻ drift layer 1 with the interlayer insulating film 4 interposed therebetween. The metal film which will be the emitter electrode 5 is formed so as to commonly contact with the surfaces of the n⁺ emitter region 8 and the p base layer 2.

A p⁺ collector layer 13 is formed on a surface layer of the rear surface of the semiconductor substrate which will be the n⁻ drift layer 1 (n⁻ base layer). A collector electrode 6 comes into ohmic contact with the surface of the p⁺ collector layer 13. In many cases, a p⁺ contact layer 9 is provided in the p base layer 2 in order to improve the latch-up resistance of the trench gate IGBT. In addition, it is preferable that an n⁺ buffer layer 14 be provided between the n⁻ drift layer 1 and the p⁺ collector layer 13. In this case, it is possible to reduce the thickness of the high-resistance n⁻ drift layer 1.

A region in which a doped polysilicon gate electrode 11 for a gate runner is formed on the surface of the p-type extension region C with the gate oxide film 10 interposed therebetween and the emitter electrode contact hole 21, which is an opening of an oxide film for bringing the emitter electrode 5 into direct contact with a silicon surface, are provided in the surface (the surface close to the front surface of the semiconductor substrate) of the p-type extension region C of the p base layer 2. It is preferable that the emitter electrode contact hole 21 be provided in the vicinity of the outside of the annular outer trench 3a, on the side of the p-type extension region C close to the annular outer trench 3a. This is because resistance is effective in the lateral direction from the outermost periphery of the p-type extension region C to the n⁻ drift layer 1 to prevent breakdown due to current concentration when the device is turned off. The lateral direction is a direction parallel to the main surface of the semiconductor substrate which will be the n⁻ drift layer 1.

The width of the emitter electrode contact hole 21 may be more than the second gap b between the annular outer trench 3a and the outermost trench 3 or between adjacent annular outer trenches 3a in order to prevent breakdown when the device is turned off. The doped polysilicon gate electrode 11 for a gate runner and the doped polysilicon gate electrode 11 for a trench gate structure are formed at the same time and are electrically connected to each other in a portion (not illustrated). In addition, an aluminum gate electrode line 12 serving as a gate runner comes into contact with the surface of the doped polysilicon gate electrode 11 for a gate runner through an opening formed in a silicon oxide film. The doped polysilicon gate electrode 11 for a trench gate structure is drawn to the surface of the chip by the aluminum gate electrode line 12.

The edge termination structure region 40 is provided outside the p-type extension region C which is disposed at the outer circumferential edge of the p base layer 2. In the edge termination structure region 40, annular p⁺ guard rings 15 and 16 are provided at a depth equal to or more than the depth of the p base layer 2, with a predetermined gap from the p-type extension region C. The p⁺ guard rings 15 and 16 which are a portion of the edge termination structure region 40 surround the active region 30. Doped polysilicon field plates 18 and 19 are respectively provided on the surfaces of the p⁺ guard rings 15 and 16, with an insulating film 17 which is formed at the same time as the gate oxide film 10 interposed therebetween.

The doped polysilicon field plates 18 and 19 are formed so as to cover the surfaces of the p⁺ guard rings 15 and 16 and the surface of portions of the n⁻ drift layer 1 adjacent to the p⁺ guard rings. The p⁺ guard rings 15 and 16 and the doped polysilicon field plates 18 and 19 are electrically connected to each other in a portion (not illustrated) by the aluminum field plate 20.

As described above, according to the trench gate IGBT of the embodiment, the second gap between the annular outer trench and the outermost trench or between adjacent annular outer trenches is less than the first gap between adjacent trenches for a trench gate structure. Therefore, it is possible to prevent the concentration of the electric field in the vicinity of the bottom of the trench gate. In addition, the p-type extension region and the emitter electrode are connected to each other on the surface of the annular-outer-trench-side end of the p-type extension region. Therefore, it is possible to prevent the concentration of the electric field on the p-type extension region when the device is turned off. In this way, it is possible to prevent the occurrence of avalanche breakdown at a low voltage and prevent a reduction in the breakdown voltage. In addition, it is possible to prevent the occurrence of breakdown due to the concentration of the electric field and improve turn-off breakdown voltage.

In the above-described embodiment of the invention, the first conduction type is an n type, and the second conduction type is a p type. However, in the invention, the first conduction type may be a p type and the second conduction type may be an n type. In this case, the same effect as described above is obtained.

As described above, the semiconductor device according to the invention is useful for a power semiconductor device which is used in, for example, a power conversion device.

What is claimed is:

1. A semiconductor device comprising:
   an active region; and
   an edge termination structure region that surrounds the active region,
   wherein the active region includes:
   a first-conduction-type drift layer that is a first-conduction-type semiconductor substrate;
   a second-conduction-type base layer that is provided in one main surface of the first-conduction-type semiconductor substrate;
   a first-conduction-type semiconductor region that is selectively provided in the second-conduction-type base layer;
   a plurality of trenches that extend from the one main surface of the first-conduction-type semiconductor substrate to the first-conduction-type drift layer through the first-conduction-type semiconductor region and the second-conduction-type base layer and are arranged with a predetermined first gap therebetween;
   a trench gate structure including a gate insulating film that is provided in the trench along an inner wall of the trench and a gate electrode that is provided in the trench with the gate insulating film interposed therebetween;
   a metal electrode that contacts the second-conduction-type base layer and the first-conduction-type semiconductor region;
   a second-conduction-type extension region that is a portion of the second-conduction-type base layer which extends outward from the outermost trench among the plurality of trenches; and
   one or more annular outer trenches that extend from the one main surface of the first-conduction-type semiconductor substrate to the first-conduction-type drift layer through the second-conduction-type extension region and surround all of the trenches, and
   a second gap between the annular outer trench and the outermost trench or between the adjacent annular outer trenches when the plurality of annular outer trenches are provided is less than the first gap.

2. The semiconductor device according to claim 1, wherein the plurality of trenches are arranged in the one main surface of the first-conduction-type semiconductor substrate in a stripe shape which extends in a direction perpendicular to a direction in which the trenches are arranged.

3. The semiconductor device according to claim 1, wherein, when the second gap is b and the first gap is a, b/a<0.8 is satisfied.

4. The semiconductor device according to claim 1,
wherein, when the second gap is b and the first gap is a, b/a<0.6 is satisfied.

5. The semiconductor device according to claim 1,
wherein a surface of a portion of the second-conduction-type extension region which is interposed between the annular outer trench and the outermost trench or between the adjacent annular outer trenches when the plurality of annular outer trenches are provided is electrically connected to the metal electrode.

6. The semiconductor device according to claim 1,
wherein two or more annular outer trenches are provided.

7. The semiconductor device according to claim 1, further comprising:
an insulating film that covers the second-conduction-type extension region,
wherein the insulating film includes an opening through which a portion of the second-conduction-type extension region which is arranged outside the outermost annular outer trench is exposed, and
the second-conduction-type extension region is electrically connected to the metal electrode through the opening.

8. The semiconductor device according to claim 1, further comprising:
an insulating film that is provided on the one main surface of the first-conduction-type semiconductor substrate and insulates the metal electrode from the gate electrode,
wherein a portion which directly contacts the metal electrode and a portion which contacts the metal electrode with the insulating film interposed therebetween are alternately arranged on the one main surface of the first-conduction-type semiconductor substrate in the active region.

9. The semiconductor device according to claim 1,
wherein the ends of two adjacent trenches are connected to each other.

* * * * *